United States Patent
Huang et al.

(10) Patent No.: US 7,713,882 B2
(45) Date of Patent: May 11, 2010

(54) PATTERNING METHOD FOR A SEMICONDUCTOR SUBSTRATE

(75) Inventors: Chien-Er Huang, Sindian (TW);
Kuo-Yao Cho, Da-An Township, Taichung County (TW)

(73) Assignee: Nanya Technology Corporation, Taoyuan County (TW)

( * ) Notice: Subject to any disclaimer, the term of this patent is extended or adjusted under 35 U.S.C. 154(b) by 117 days.

(21) Appl. No.: 12/073,578

(22) Filed: Mar. 7, 2008

(65) Prior Publication Data
US 2009/0149024 A1    Jun. 11, 2009

(30) Foreign Application Priority Data
Dec. 7, 2007    (TW) .............................. 96146718 A

(51) Int. Cl.
*H01L 21/302* (2006.01)
*H01L 21/461* (2006.01)

(52) U.S. Cl. .................. 438/735; 438/525; 438/551; 438/736; 257/E21.038; 257/E21.039; 257/E21.235

(58) Field of Classification Search .............. 438/525, 438/551, 735, 736, 945, 947; 257/E21.024, 257/E21.032, E21.033, E21.035, E21.036, 257/E21.038, E21.039, E21.315, E21.316, 257/E21.236, E21.235, E21.232
See application file for complete search history.

(56) References Cited

U.S. PATENT DOCUMENTS

| | | | | |
|---|---|---|---|---|
| 6,194,268 | B1 * | 2/2001 | Furukawa et al. | 438/257 |
| 7,316,978 | B2 * | 1/2008 | Lee et al. | 438/703 |
| 7,553,771 | B2 * | 6/2009 | Kim et al. | 438/705 |

* cited by examiner

*Primary Examiner*—Caridad M Everhart
(74) *Attorney, Agent, or Firm*—Rosenberg, Klein & Lee

(57) ABSTRACT

A patterning method for a semiconductor substrate is disclosed. A substrate is provided and a stack structure is laid thereon. The stack layer includes at least a target layer and a pad layer sequentially formed on the substrate. Follow by a lithography process, wherein photoresists are laid on the stack layer to form a plurality of photoresist elements. Thus, a plurality of pattern is formed on the target layer, and a portion of target layer's surface is exposed. Lastly, ion implanting is provided and defines a doped area as hard mask for the etching process.

8 Claims, 6 Drawing Sheets

PATTERNING METHOD FOR A SEMICONDUCTOR SUBSTRATE

BACKGROUND OF THE INVENTION

1. Field of the Invention

The present invention relates to a patterning method for a semiconductor substrate, and more specifically to a patterning method via ion implanting.

2. Description of Related Art

For semiconductor manufacture, the sizes of electronic elements are gradually getting smaller in the course of producing and developing integrated circuits (IC). Historically, the size of a wafer reduces by 30% every two to three years, and today, some mass production of the electronic elements have reached sizes of less than 100 nm. As the electronic component density increases, the efficiency also increases (higher processing speed and lower consumed power). Thus, it is necessary to develop and improve the resolution of processing technology in order to produce smaller electronic components and to manufacture such components with higher efficiency.

Lithography is one of the important prior arts of semiconductor manufacturing technologies; wherein by optical improvements, the resolution of pattern transfer is increased and the critical dimension of the line thickness is reduced. However, limitation exists for improving lithography by only optical improvement. For example, look at optical lithography that is generally used by the industry in the past, due to the characteristics of optical physics, it cannot reduce the line thickness nor increase the resolution of pattern transfer as the line thickness reaches below 65 nm to 45 nm. The present invention aims to remedy the limitation.

SUMMARY OF THE INVENTION

The object of the present invention is to provide a patterning method for a semiconductor substrate, and more specifically to a hard mask manufacturing method using ion implanting, which can reduce the line thickness and improve the resolution of the pattern transfer.

For achieving the object described above, the present invention provides a patterning method, the method includes: providing a substrate, a target layer and a pad layer sequentially formed on the surface of the substrate; Patterning the pad layer to expose a portion of the target layer. Carrying out an ion planting process on the portion of the target layer to form an ion doped area and an ion undoped area thereon. The pad layer and the undoped area are removed to expose a portion of the substrate surface. The ion doped area acts as a hard mask to remove a portion of the substrate to form a patterning structure inside the substrate.

For achieving the object described above, the present invention provides another patterning method, the method includes: providing a substrate, a target layer and a first pad layer sequentially formed on the surface of the substrate; Patterning the first pad layer to expose a portion of the target layer. A contoured second pad layer is formed on the substrate to cover the first layer patterning and the exposing target layer. Carrying out an ion implanting process with a tilted angle on the second pad layer to form an ion doped area and an undoped area thereof, wherein the undoped area covers a portion of the target layer. The doped area and the first pad layer are removed to expose the target layer. The exposing portion of the target layer is removed using the undoped area as a hard mask to make the target layer form a patterning structure.

DETAILED DESCRIPTION OF THE PREFERRED EMBODIMENTS

As described above, the present invention discloses a patterning method for a semiconductor substrate, and more specifically to a patterning method using ion implanting to form a hard mask, and thus able to reduce the line thickness and improve the resolution of pattern transfer.

Different embodiments or examples are provided in following context, and the present invention will be described more specifically with reference to the following embodiments to demonstrate the different characteristics used in the various embodiments.

Figure 1:
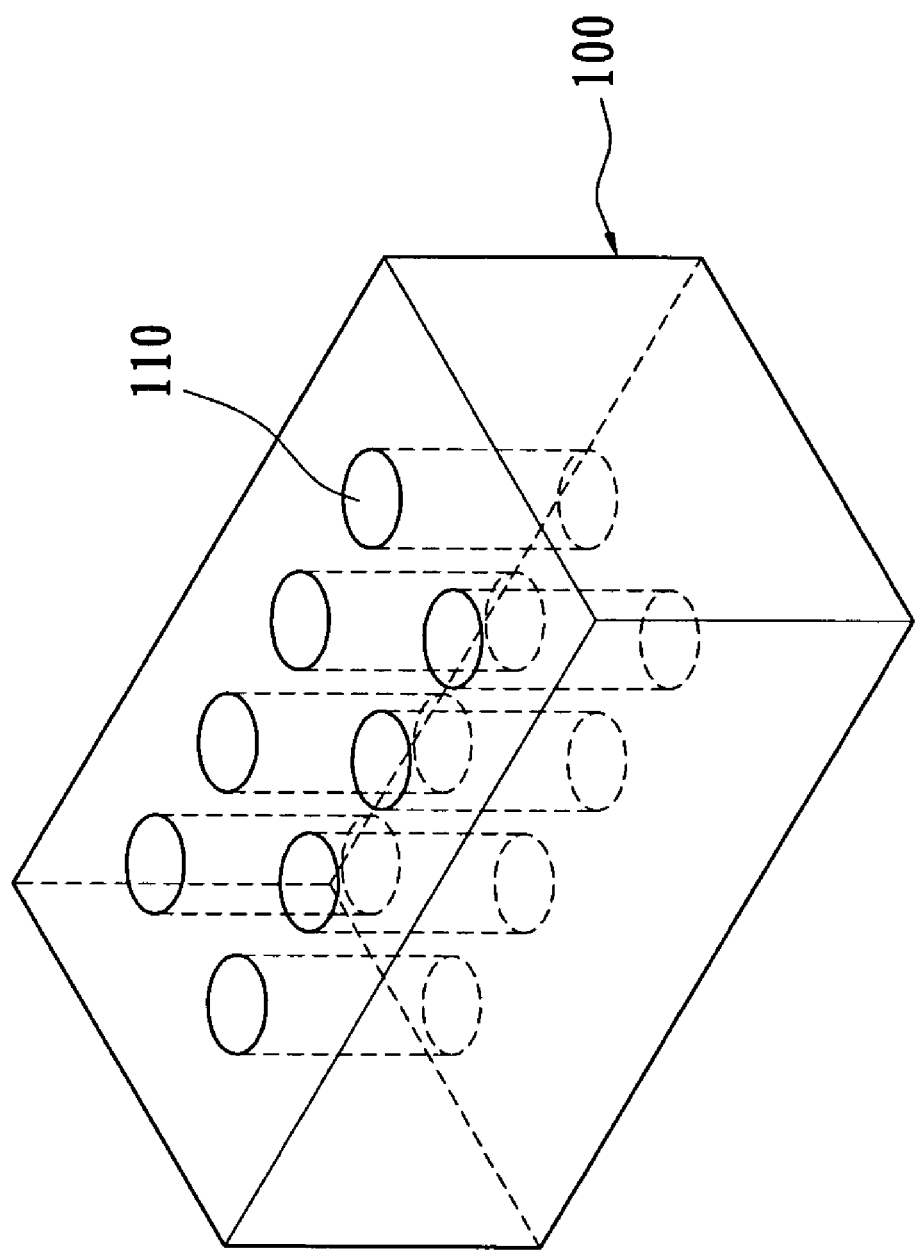
FIG. 1 is a schematic view showing a patterning structure according to the present invention.

Please refer to FIG. 1 illustrating a schematic view showing an embodiment of a patterning structure according to the present invention, which forms a device 100 having a patterning structure. Patterning structure 110 may have any particular shape, such as line, island, or circle.

Please refer to FIGS. 2A-2F sequentially, a preferred embodiment of a patterning method according to the present invention is disclosed.

Figure 2A:
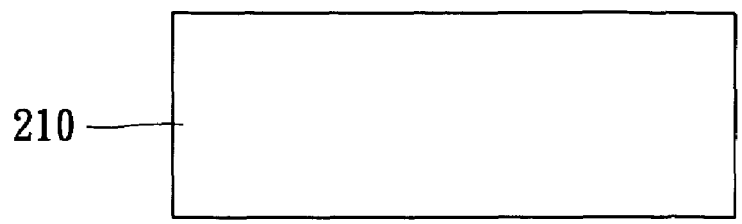
FIGS. 2A-2F are schematic views showing a preferred embodiment of a patterning method according to the present invention.

First, please refer to FIG. 2A which provides a substrate 210; wherein substrate 210 is a semiconductor substrate or at least a combined substrate such as a pad oxide layer (not shown) combined with a dielectric layer (not shown). In a more detailed example, the semiconductor substrate is a silicon substrate; the material of the pad oxide layer is polycrystal silicon or amorphous silicon, and the thickness of the pad oxide layer is about 50 nm to 150 nm; the dielectric layer could be a nitride layer, and the thickness of the dielectric layer is about 3 nm.

Figure 2B:
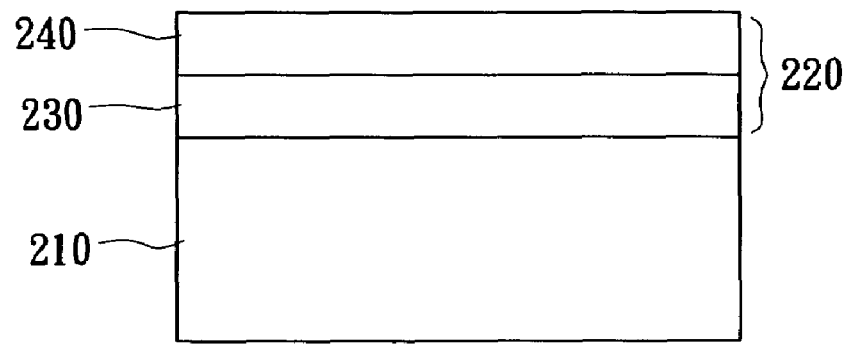
Figure 2C:
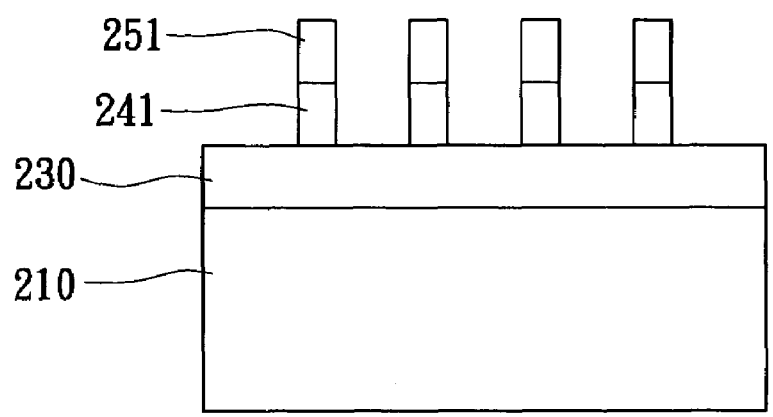

Please refer to FIG. 2B, a stack layer 220 is laid on substrate 210, and stack layer 220 includes a target layer 230 and a pad layer 240 which are sequentially laid thereon. For example, the material of target layer 230 is of undoped polysilicon or amorphous silicon, and the thickness of target layer 230 is about 10 nm to 30 nm; pad layer 240 is a bottom anti-reflective coating (BARC), and the thickness of the pad layer 240 is about 40 nm to 50 nm. Please refer to FIG. 2C, a lithography process is carried out. A photoresist layer (not shown) is laid on the stack structure (not shown). A plurality of photoresist elements 251 are formed after exposure. Then these photoresist elements 251 act as hard masks to selectively remove a portion of the pad layer to form a plurality of pad layer elements 241, and a portion of target layer 230's surface is exposed. Aforementioned removal method could be anisotropic etching.

Figure 2D:
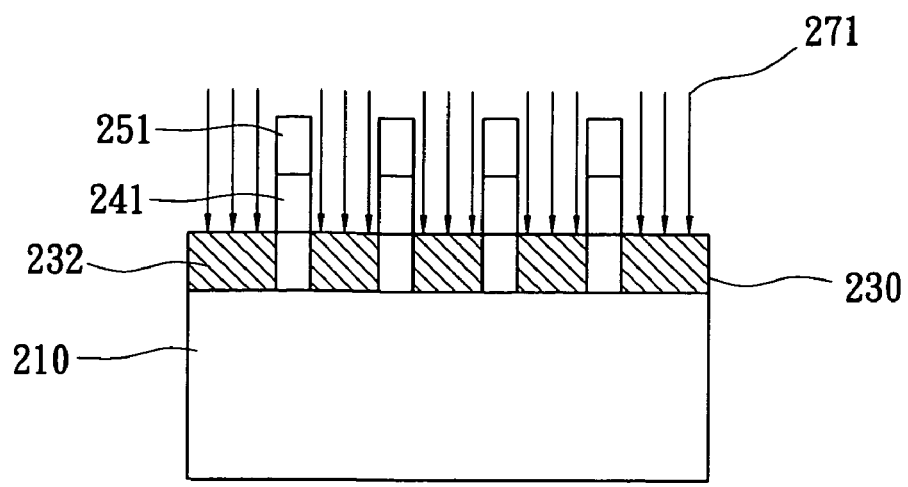

Please refer to FIG. 2D, an ion implanting process is carried out on the exposed portion of target layer 230. Ions are forced in from the direction indicated by arrows of ion implanting direction 271, which is perpendicular to the surface of substrate 210 in order to create a doped area 232 which formed inside target layer 230. For example, the ions used in the ion implanting process could be trivalent ions or pentavalent ions, such as boron and BF2. The ion implanting voltage is between 5 keV (Kilo-Electron Volt) to 20 keV, and the ion concentration is between 1014 ions/cm2 to 1015 ions/cm2.

Figure 2E:
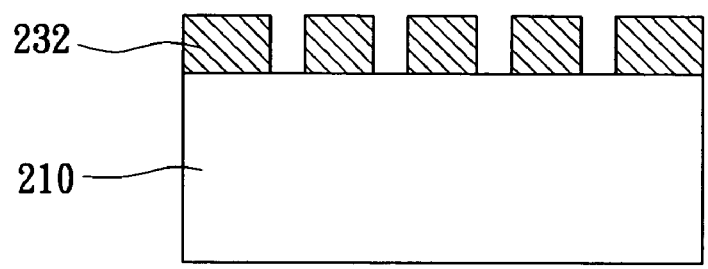

Please refer to FIG. 2E, photoresist elements 251 and pad layer elements 241 from FIG. 2D are removed in an orderly fashion, and the removing method could be the prior art of etching method or CMP (Chemical Mechanical Polishing) method. Next, the undoped target layer 230 is removed by the etching method according to the etching selecting rate of doped area 232 and the UN-doped target layer 230 (Please refer to FIG. 2D), in order to keep doped area 232 and to expose a portion of substrate surface. The etching process could be wet etching which usually includes at least HF and HNO3 etching solution.

Figure 2F:
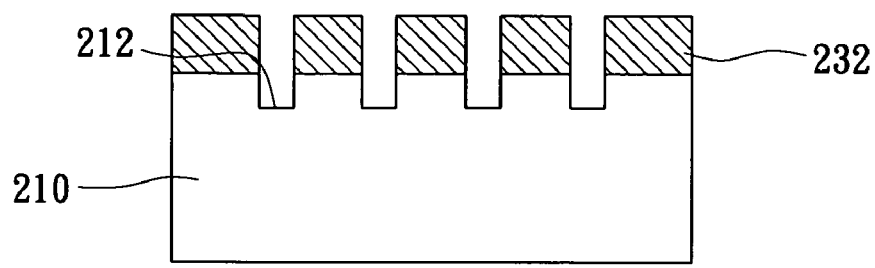

Finally, please refer to FIG. 2F of the present invention's embodiment, doped area 232 acts as a hard mask to selectively remove a portion of substrate 210 to form a plurality of trenches (a.k.a. patterning structures) 212 in substrate 210. The selectively removing method could be an anisotropic etching process, and the anisotropic etching process could be dry etching that generally at least includes the gas mixture of CHF3 and O2, or the gas mixture of CHF2, CHF3, and N2. Finally, doped area 232 is removed and the resulting patterning structures 212 is formed and exposed.

It should be emphasized here that although doped area 232 acts as a hard mask to selectively remove a portion of substrate 210, persons skilled in the art should appreciate that the aforementioned pad layer elements 241 or even photoresist elements 251 can be kept; wherein the integrating structure may be used as a hard mask to selectively remove a portion of substrate 210 and then finally removed sequentially from the substrate surface at the end.

Please refer to FIGS. 3A-3F sequentially, where another preferred embodiment of a patterning method according to the present invention is disclosed.

Figure 3A:
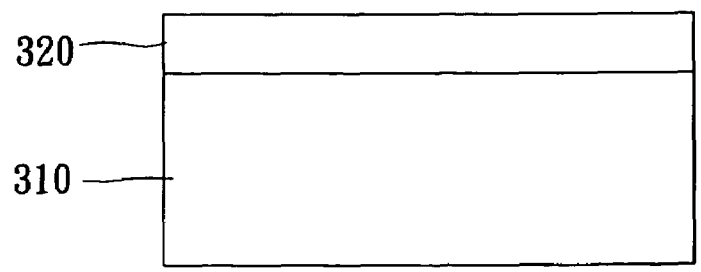
FIGS. 3A-3F are schematic views showing another preferred embodiment of the patterning method according to the present invention.

First, please refer to FIG. 3A providing a substrate 310 and a target layer 320, wherein target layer 320 lay upon substrate 310. For a more detailed example, substrate 310 is a silicon substrate; the material of target layer 320 could be a conductive material (such as crystal silicon or metal) or dielectric material (such as Si3N4), and the thickness of target layer 320 is about 100 nm to 20 nm.

Figure 3B:
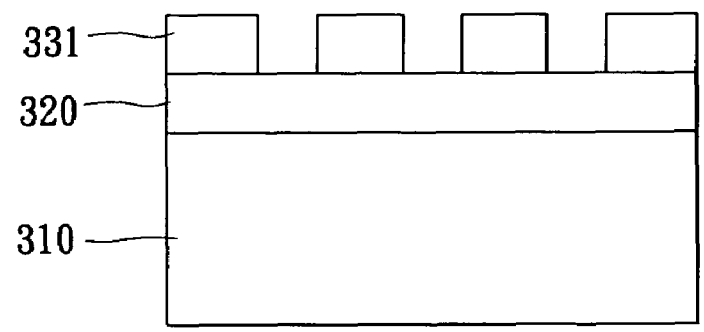

Please refer to FIG. 3B, a photoresist layer is laid on a target layer 320 as a first pad layer (not shown) to carry out a lithography process to form a plurality of photoresist elements 331, and a portion of the target layer 320's surface is exposed. It should be emphasized here that the horizontal shape of the aforementioned photoresist elements 331 is not meant to limit the scope of the present invention. Other shapes such as line, island, or circle may be applied depending on design requirement.

Figure 3C:
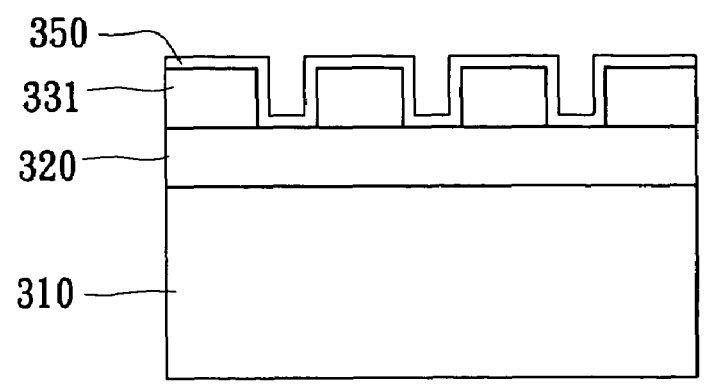

Please refer to FIG. 3C, a second pad layer 350 is uniformly deposited to cover the surface of photoresist elements 331 and a portion of target layer 320's surface. For example, the material of second pad layer 350 could be UN-doped poly silicon or amorphous silicon, and the thickness of second pad layer 350 is about 50 angstrom to 100 angstrom. It should be emphasized here that although the contoured second pad layer 350 is directly deposited on the photoresist elements 331, but in other embodiments of the present invention, other additional contoured pad layers may be formed on the surfaces of photoresist elements 331 and target layer 320 before forming second pad layer 350 depending on the needs of processes, and then to finally cover second pad layer 350. It should be noted that regardless of the depositing type and thickness, the height and the configuration of the surfaces must be kept.

Figure 3D:
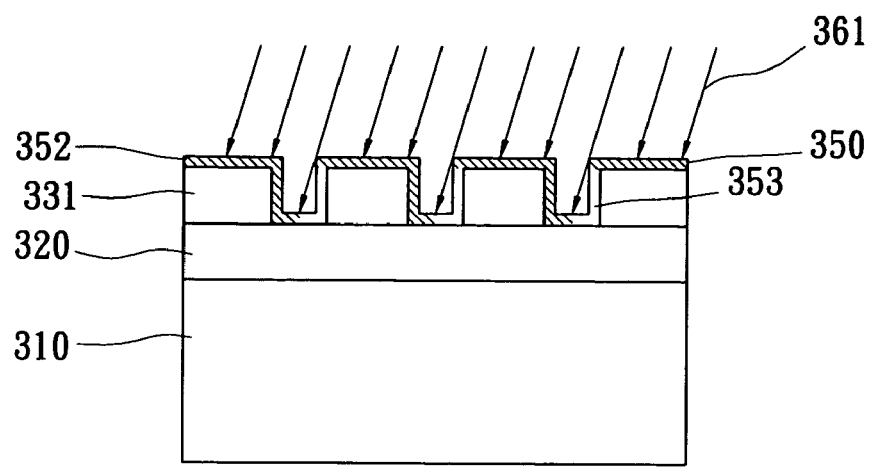

Please refer to FIG. 3D, a tilt-angle ion implanting process 361 is carried out on second pad layer 350, which aims to use the ion implanting angles in relation to the height and the configuration formed on top of substrate 310's surface by photoresist elements 331, thus, only a portion of second pad layer 350 is formed into a doped area 352, and a portion of shaded area is un-doped area 353; wherein undoped area 353 is the area that did not underwent the ion implanting process. For example, the ions used in the ion implanting process are trivalent ions or pentavalent ions, such as boron and BF2. The ion implanting voltage is between 5 keV (Kilo-Electron Voltage) to 20 keV, and the ion concentration is between 1014 ions/cm2 to 1015 ions/cm2.

Figure 3E:
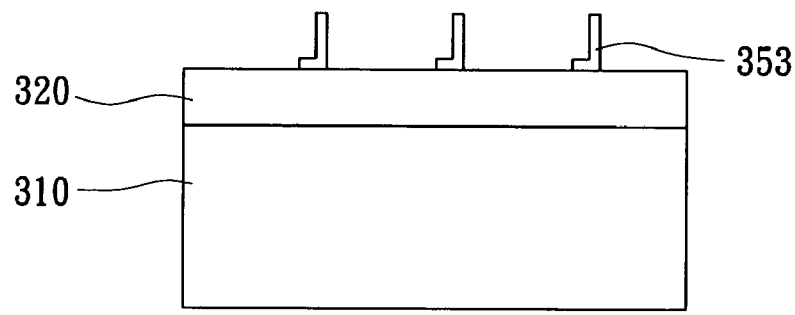

Please refer to FIG. 3E, doped area 352 is removed to further exposes a portion of the target layer 320's surface via methods such as the etching method; wherein the etching selective rate of doped area 352 (Please refer to FIG. 3D) and undoped area 353 (Please refer to FIG. 3D) is used. For further example, the etching process may be wet etching which generally includes at least ammonia (NH3) etching solution.

Figure 3F:
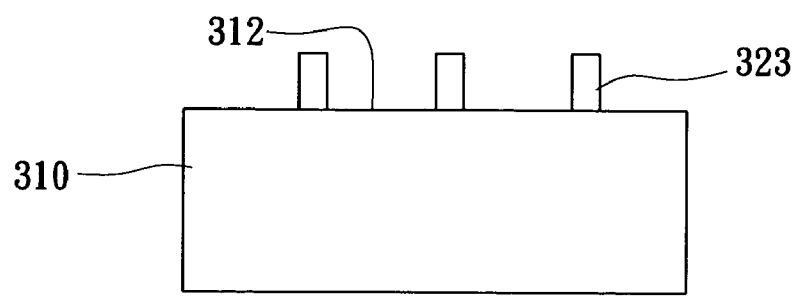

Please refer to FIG. 3F, undoped area 353 of second pad layer 350 acts as a hard mask to selectively remove a portion of target layer 320 to expose a portion of target layer 320's surface. Undoped area 353 is finally removed to form a patterning structure 312. For example, a portion of the target layer 320 is removed via process such as a dry etching process, and generally includes at least the gas mixture of CHF3 and O2, or the gas mixture of CHF2, CHF3, and N2. Undoped area 353 is removed via method such as wet etching method, and generally includes at least hydrofluoric acid and nitric acid etching solution.

Figures 4, 5:
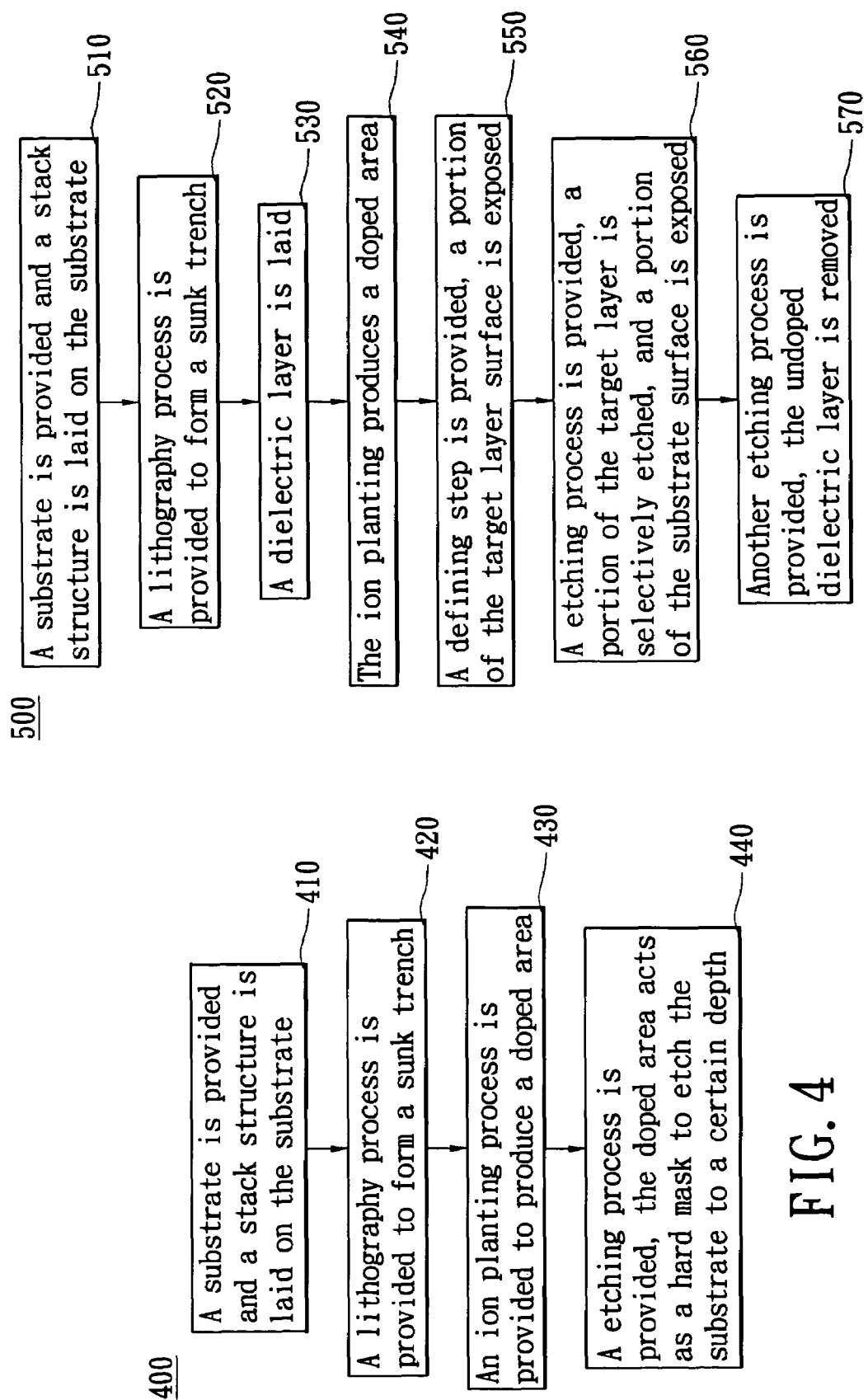
FIGS. 4-5 are flowcharts showing the patterning method according to the present invention.

Please refer to FIG. 4 showing a method flowchart for manufacturing a patterning structure according to an embodiment 400, which corresponds with the patterning method showed in FIGS. 2A-2F. In step 410 of method 400, a substrate is provided and a stack structure is laid on the substrate; then, in step 420, a lithography process is provided in order to form a sunk trench (a.k.a. patterning structure); subsequently, in step 430, an ion planting process is provided to produce a doped area; lastly, in step 440, a etching process is provided, the doped area acts as a hard mask to etch the substrate to a certain depth to form a device with a patterning structure.

Please refer to FIG. 5 showing a method flowchart for manufacturing a patterning structure according to another embodiment 500, which corresponds with the method of manufacturing a patterning structure shown in FIGS. 3A-3F. In step 510 of method 500, a substrate is provided and a stack structure is laid on the substrate; then, in step 520, a lithography process is provided in order to form a sunk trench (a.k.a. patterning structure); subsequently, in step 530, a dielectric layer is laid; follow by step 540, where the ion planting produces a doped area; subsequently, in step 550, a defining step is provided, a portion of the target layer surface is exposed; then, in step 560, an etching process is provide, a portion of the target layer is selectively etched, and a portion of the substrate surface is exposed; lastly, in step 570, another etching process is provided, and the undoped dielectric layer is removed.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A patterning method comprising:
providing a substrate with a target layer and a first pad layer sequentially formed thereon;
patterning said first pad layer to partially expose said target layer; uniformly forming a second pad layer on said patterned first pad layer and said exposed target layer to cover a top face as well as side faces of said patterned first layer and a face of said exposed target layer;
performing a tilt-angel ion implant process on the second pad layer to form doped areas and un-doped areas therein, removing said doped areas and said first pad layer to partially expose said target layer and to partially cover said target layer by said un-doped areas; and
removing said exposed target layer and said un-doped areas of said first pad layer to form a patterned target layer.

2. The patterning method according to claim 1, wherein said second pad layer is UN-doped poly silicon.

3. The patterning method according to claim 1, wherein a voltage of said tilt-angel ion implant process is between 5 keV and 20 keV.

4. The patterning method according to claim 1, wherein an ion concentration used in said tilt-angel ion implant process is between $10^{14}$ ions/cm$^2$ to $10^{15}$ ions/cm$^2$.

5. The patterning method according to claim 1, wherein said tilt-angel ion implant process uses trivalent ions.

6. The patterning method according to claim 5, wherein said trivalent ion is boron.

7. The patterning method according to claim 1, wherein said tilt-angel ion implant process uses pentavalent ions.

8. The patterning method according to claim 7, wherein said trivalent ion is BF2.

* * * * *